(12) United States Patent
Hasunuma

(10) Patent No.: US 12,255,277 B2
(45) Date of Patent: Mar. 18, 2025

(54) ELEMENT SUBSTRATE, LIGHT-EMITTING ELEMENT MODULE, AND LIGHT-EMITTING DEVICE

(71) Applicant: KYOCERA CORPORATION, Kyoto (JP)

(72) Inventor: Ryota Hasunuma, Higashiomi (JP)

(73) Assignee: KYOCERA CORPORATION, Kyoto (JP)

( * ) Notice: Subject to any disclaimer, the term of this patent is extended or adjusted under 35 U.S.C. 154(b) by 656 days.

(21) Appl. No.: 17/598,298

(22) PCT Filed: Mar. 19, 2020

(86) PCT No.: PCT/JP2020/012508
§ 371 (c)(1),
(2) Date: Sep. 27, 2021

(87) PCT Pub. No.: WO2020/203372
PCT Pub. Date: Oct. 8, 2020

(65) Prior Publication Data
US 2022/0181532 A1  Jun. 9, 2022

(30) Foreign Application Priority Data
Mar. 29, 2019 (JP) .................. 2019-068609

(51) Int. Cl.
*H01L 33/62* (2010.01)
*H01L 33/64* (2010.01)

(52) U.S. Cl.
CPC ........... *H01L 33/62* (2013.01); *H01L 33/641* (2013.01); *H01L 33/642* (2013.01)

(58) Field of Classification Search
CPC ... H01L 23/36; H01L 23/3738; H01L 33/644; H01L 25/16; H01L 25/167; H01L 25/075; H01L 25/0756
See application file for complete search history.

(56) References Cited

U.S. PATENT DOCUMENTS

| | | | |
|---|---|---|---|
| 8,456,069 B2 * | 6/2013 | Lee ..................... | H10K 59/8794 362/373 |
| 2012/0133427 A1 * | 5/2012 | Kim ....................... | H01L 25/16 327/564 |
| 2016/0290620 A1 | 10/2016 | Ichikawa et al. | |

(Continued)

FOREIGN PATENT DOCUMENTS

| JP | S58193171 A | 11/1983 |
|---|---|---|
| JP | 2010532214 A | 10/2010 |

(Continued)

*Primary Examiner* — Walter H Swanson
*Assistant Examiner* — Mozataz Khalifa
(74) *Attorney, Agent, or Firm* — HAUPTMAN HAM, LLP

(57) ABSTRACT

An element substrate includes an insulating substrate, electrode wiring located on the insulating substrate, a heat-dissipating member in contact with the insulating substrate, a flexible substrate electrically connected to the electrode wiring, a temperature detecting element located on the flexible substrate, and an adhesive layer. The adhesive layer is located between the temperature detecting element and an extending portion in the heat-dissipating member and between a facing surface of the flexible substrate and the extending portion in the heat-dissipating member.

11 Claims, 3 Drawing Sheets

(56) References Cited

U.S. PATENT DOCUMENTS

| | | | |
|---|---|---|---|
| 2018/0062057 A1* | 3/2018 | Sweegers | H01L 33/62 |
| 2021/0175385 A1* | 6/2021 | Lin | H01L 31/153 |
| 2022/0157680 A1* | 5/2022 | Shanmugam | H05K 1/0278 |

FOREIGN PATENT DOCUMENTS

| | | | |
|---|---|---|---|
| JP | 2016192512 A | 11/2016 | |
| WO | 2009005853 A1 | 1/2009 | |

* cited by examiner

ELEMENT SUBSTRATE, LIGHT-EMITTING ELEMENT MODULE, AND LIGHT-EMITTING DEVICE

RELATED APPLICATIONS

The present application is a National Phase of International Application Number PCT/JP2020/012508, filed Mar. 19, 2020, which claims priority to Japanese Application No. 2019-068609, filed Mar. 29, 2019.

FIELD

The present disclosure relates to an element substrate, a light-emitting element module, and a light-emitting device.

BACKGROUND

Known techniques are described in, for example, Patent Literature 1 and Patent Literature 2.

CITATION LIST

Patent Literature

Patent Literature 1: Japanese Unexamined Patent Application Publication No. 58-193171
Patent Literature 2: Japanese Unexamined Patent Application Publication (Translation of PCT Application) No. 2010-532214

BRIEF SUMMARY

An element substrate according to an aspect of the present disclosure includes an insulating substrate including ceramics, electrode wiring located on a first surface of the insulating substrate and electrically connectable to an element, a heat-dissipating member in contact with a second surface of the insulating substrate opposite to the first surface, a flexible substrate electrically connected to the electrode wiring, a temperature detecting element located on a facing surface of the flexible substrate facing the heat-dissipating member or facing the insulating substrate, and an adhesive layer located at least between the temperature detecting element and the heat-dissipating member or between the facing surface and the heat-dissipating member.

A light-emitting element module according to another aspect of the present disclosure includes the element substrate described above, and a light-emitting element being the element electrically connected to the electrode wiring.

A light-emitting device according to another aspect of the present disclosure includes the light-emitting element module described above, a heat sink receiving the light-emitting element module, and a fan that air-cools the heat sink.

BRIEF DESCRIPTION OF DRAWINGS

The objects, features, and advantages of the present disclosure will become more apparent from the following detailed description and the drawings.

DETAILED DESCRIPTION

Light-emitting elements such as light-emitting diodes (LEDs), and logic elements such as integrated circuits (ICs) generate heat during operation. Heat generation can adversely affect such elements, or for example, deteriorate their electrical properties or shorten their service life. To cool such elements that generate heat, the structure that forms the basis of an element substrate according to one or more embodiments of the present disclosure includes a heat-dissipating member for dissipating heat, such as a heat sink, under a substrate on which elements are mounted.

To determine whether the elements are cooled sufficiently, a thermistor may be used to detect the temperature of the elements. The thermistor detects, for example, the temperature of the heat sink to indirectly determine the temperature of the elements.

The structure that forms the basis of the element substrate according to one or more embodiments of the present disclosure uses indirect detection of the temperature and thus may control the elements based on insufficiently accurate temperatures due to insufficient responsiveness. The thermistor is to be nearer the elements to detect the temperature of elements accurately. For example, the thermistor may be located on a flexible substrate that is electrically connected to the element substrate.

However, the flexible substrate may partially vibrate or be displaced under air flow for air-cooling the metal heat-dissipating member, such as the heat sink. This may cause the thermistor to come in contact with the heat-dissipating member, possibly causing a short circuit.

Figure 1:
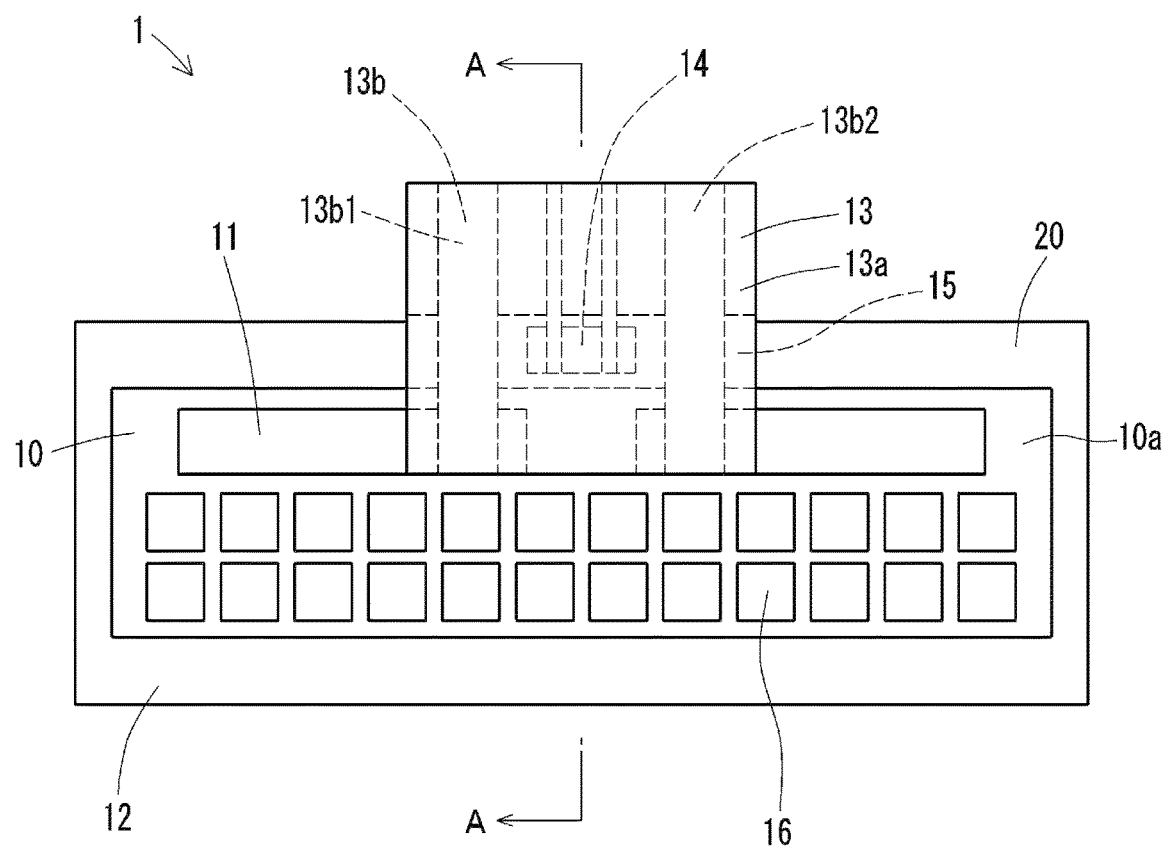
FIG. 1 is a plan view of an element substrate according to a first embodiment of the present disclosure.
Figure 2:
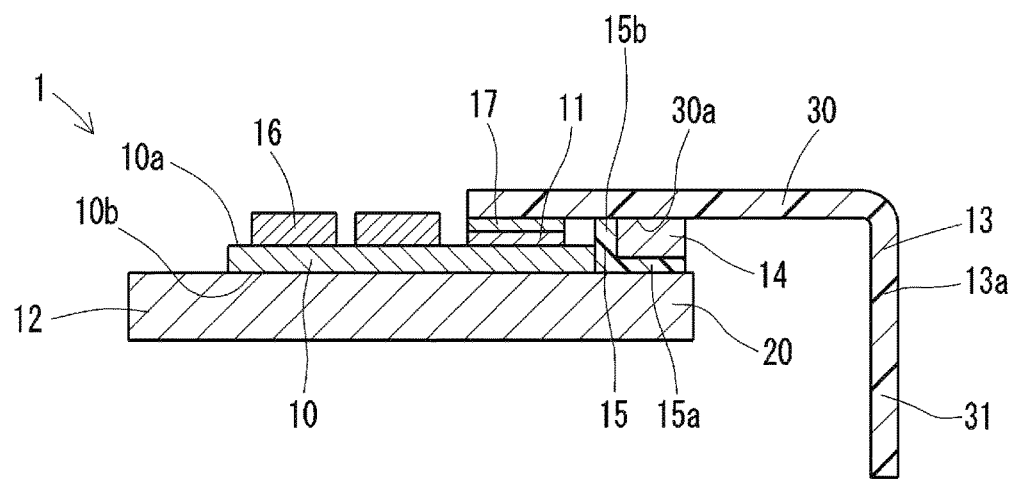
FIG. 2 is a cross-sectional view of the element substrate taken along line A-A in FIG. 1.

One or more embodiments of the present disclosure will now be described with reference to the drawings. FIG. 1 is a plan view of an element substrate according to a first embodiment of the present disclosure. FIG. 2 is a cross-sectional view of the element substrate taken along line A-A in FIG. 1. Elements mountable on the element substrate generate heat in response to a current applied during operation. Such elements include a light-emitting element such as a light-emitting diode or a semiconductor laser diode, a light receiver such as a photodiode, a logic element such as a central processing unit (CPU), a heating element such as a heating resistor (heat element), an image sensor such as a charge-coupled device (CCD), and a semiconductor memory such as a flash memory.

An element substrate 1 includes an insulating substrate 10, electrode wiring 11 on the insulating substrate 10, a heat-dissipating member 12 bonded to the insulating substrate 10, a flexible substrate 13 electrically connected to the electrode wiring 11, a temperature detecting element 14 mounted on the flexible substrate 13, and an adhesive layer 15.

The insulating substrate 10 is a highly heat-conductive ceramic substrate, such as an aluminum oxide ($Al_2O_3$) substrate, an aluminum nitride (AlN) substrate, or a silicon nitride ($Si_3N_4$) substrate. The insulating substrate 10 has, for example, a rectangular profile. The electrode wiring 11 is on a first surface 10a of the insulating substrate 10 and is electrically connected to elements 16. In the present embodiment, the elements 16 are mounted on the same first surface 10a as the electrode wiring 11. The electrode wiring 11 is formed from tungsten (W), molybdenum (Mo), manganese (Mn), silver (Ag), copper (Cu), an alloy containing at least one metal material selected from these metal materials, or other metal materials. The electrode wiring 11 includes an uncovered portion that may be coated with a nickel (Ni) plating layer, or a Ni plating layer further coated with a gold (Au) plating layer.

The heat-dissipating member 12 is bonded to a second surface 10b of the insulating substrate 10 opposite to the first surface 10a. The heat-dissipating member 12 may be a metal plate, a metal heat sink, or another metal component, which is formed from a metal material such as copper (Cu), aluminum (Al), or molybdenum (Mo). In the present embodiment, the heat-dissipating member 12 is a metal plate. The insulating substrate 10 and the heat-dissipating member 12 can be bonded together with, for example, a brazing material such as a silver brazing material.

In the present embodiment, the heat-dissipating member 12 has a rectangular profile larger than the profile of the insulating substrate 10. The heat-dissipating member 12 includes an extending portion 20 extending from the insulating substrate 10 as viewed in plan. The extending portion 20 surrounds the insulating substrate 10. The heat-dissipating member 12 with a larger profile has a larger heat-dissipating and heat-conducting area, and thus cools the elements 16 more efficiently.

The flexible substrate 13 includes, for example, a resin film 13a as a flexible insulating substrate formed from a resin material such as polyimide, and signal wiring 13b on one surface of the resin film 13a. The signal wiring 13b has one end electrically connected to the electrode wiring 11. The signal wiring 13b has the other end electrically connected to a control board (described later) or to other components. The signal wiring 13b and the electrode wiring 11 are bonded together with a bond 17, such as solder.

The flexible substrate 13 includes a first portion 30 facing the first surface 10a of the insulating substrate 10 and the extending portion 20 in the heat-dissipating member 12, and a second portion 31 connected to and bending from the first portion 30. The first portion 30 has a facing surface 30a facing the extending portion 20. The temperature detecting element 14 is mounted on the facing surface 30a.

The temperature detecting element 14 may be a thermistor. The temperature detecting element 14 mounted on the facing surface 30a is adjacent to the extending portion 20, or either adjacent to or in contact with the insulating substrate 10, and detects the temperature of the extending portion 20. The extending portion 20 is adjacent to the insulating substrate 10. This allows accurate temperature detection at a position nearer the elements mounted on the element substrate 1 than positions for known temperature detectors. The temperature detecting element 14 adjacent to or in contact with the insulating substrate 10 may detect the temperature of the insulating substrate 10. This allows accurate temperature detection at a position still nearer the elements mounted on the element substrate 1 than the position of the extending portion 20.

The adhesive layer 15 is located at least between the temperature detecting element 14 and the heat-dissipating member 12 (extending portion 20) or between the facing surface 30a and the heat-dissipating member 12 (extending portion 20). The temperature detecting element 14 adjacent to the heat-dissipating member 12 may come in contact with the metal heat-dissipating member 12, possibly causing a short circuit. In the present embodiment, the adhesive layer 15 is located between the temperature detecting element 14 and the extending portion 20 in the heat-dissipating member 12. The adhesive layer 15 formed mainly from, for example, a silicone resin electrically insulates the temperature detecting element 14 from the heat-dissipating member 12, reducing the likelihood of a short circuit. The adhesive layer 15 is also located between the facing surface 30a of the flexible substrate 13 and the extending portion 20 in the heat-dissipating member 12. The bonding between the first portion 30 and the heat-dissipating member 12 with the adhesive layer 15 in addition to the bonding between the signal wiring 13b and the electrode wiring 11 with the bond 17 increases the bonding strength of the electrode wiring 11 and the heat-dissipating member 12 to the flexible substrate 13. The temperature detecting element 14 adjacent to or in contact with the insulating substrate 10 can lower the likelihood of a short circuit in the temperature detecting element 14. Thus, the adhesive layer 15 may be located simply between the facing surface 30a of the flexible substrate 13 and the extending portion 20 in the heat-dissipating member 12. When the temperature detecting element 14 is adjacent to or in contact with the insulating substrate 10, and also adjacent to the electrode wiring 11 or an element 16, the adhesive layer 15 may be additionally located between the electrode wiring 11 and the temperature detecting element 14, and between the element 16 and the temperature detecting element 14 to reduce the likelihood of a short circuit. The adhesive layer 15 may be additionally located between the facing surface 30a and the insulating substrate 10 independently of the position of the temperature detecting element 14.

The adhesive layer 15 includes a portion 15a between the temperature detecting element 14 and the extending portion 20 in the heat-dissipating member 12, and a portion 15b between the facing surface 30a and the extending portion 20 in the heat-dissipating member 12. The portion 15a may be connected to or separate from the portion 15b. In the present embodiment, the portion 15a is connected to the portion 15b.

The signal wiring 13b on the flexible substrate 13 includes a pair of wires 13b1 and 13b2 extending in the longitudinal direction of the resin film 13a. Among the pair of wires 13b1 and 13b2, the wire 13b1 is nearer one edge of the resin film 13a in the width direction, and the wire 13b2 is nearer the other edge of the resin film 13a in the width direction. The temperature detecting element 14 is located between the pair of wires 13b1 and 13b2 in the width direction of the resin film 13a.

Figure 3:
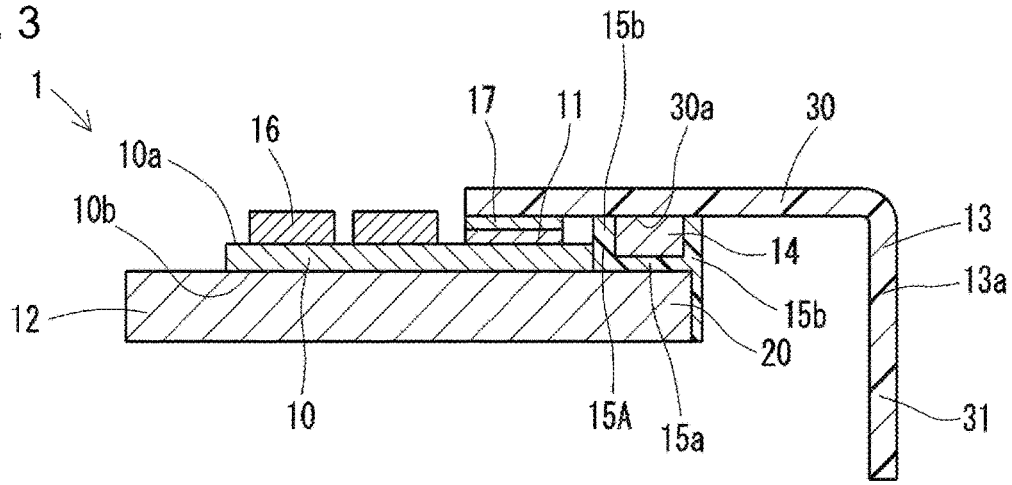
FIG. 3 is a cross-sectional view of an element substrate according to a second embodiment of the present disclosure.

FIG. 3 is a cross-sectional view of an element substrate according to a second embodiment of the present disclosure. The present embodiment is the same as the first embodiment except the structure of an adhesive layer 15A. The same components as in the first embodiment are given the same reference numerals and will not be described in detail. In the present embodiment, the temperature detecting element 14 is surrounded by the adhesive layer 15A. The adhesive layer 15A may partially extend from the facing surface 30a of the first portion 30, cover the side surface of the temperature detecting element 14, and extend across the side surface of the heat-dissipating member 12. The adhesive layer 15A between the facing surface 30a and the heat-dissipating member 12 in this manner increases the bonding strength between the heat-dissipating member 12 and the flexible substrate 13.

The temperature detecting element 14 according to the present embodiment is, for example, a rectangular prism. The temperature detecting element 14 has one surface bonded to the facing surface 30a of the first portion 30, another surface opposite to that surface covered by the portion 15a in the adhesive layer 15A, and the remaining four surfaces all covered by the portion 15b located between the facing surface 30a and the extending portion 20 in the heat-dissipating member 12. In this structure, the temperature detecting element 14 surrounded by the adhesive layer 15A and thus sealed by the adhesive layer 15A can lower the likelihood that water, dust, dirt, or other matter adheres to the temperature detecting element 14. This allows more accurate temperature detection using the temperature detecting element 14.

Figure 4:
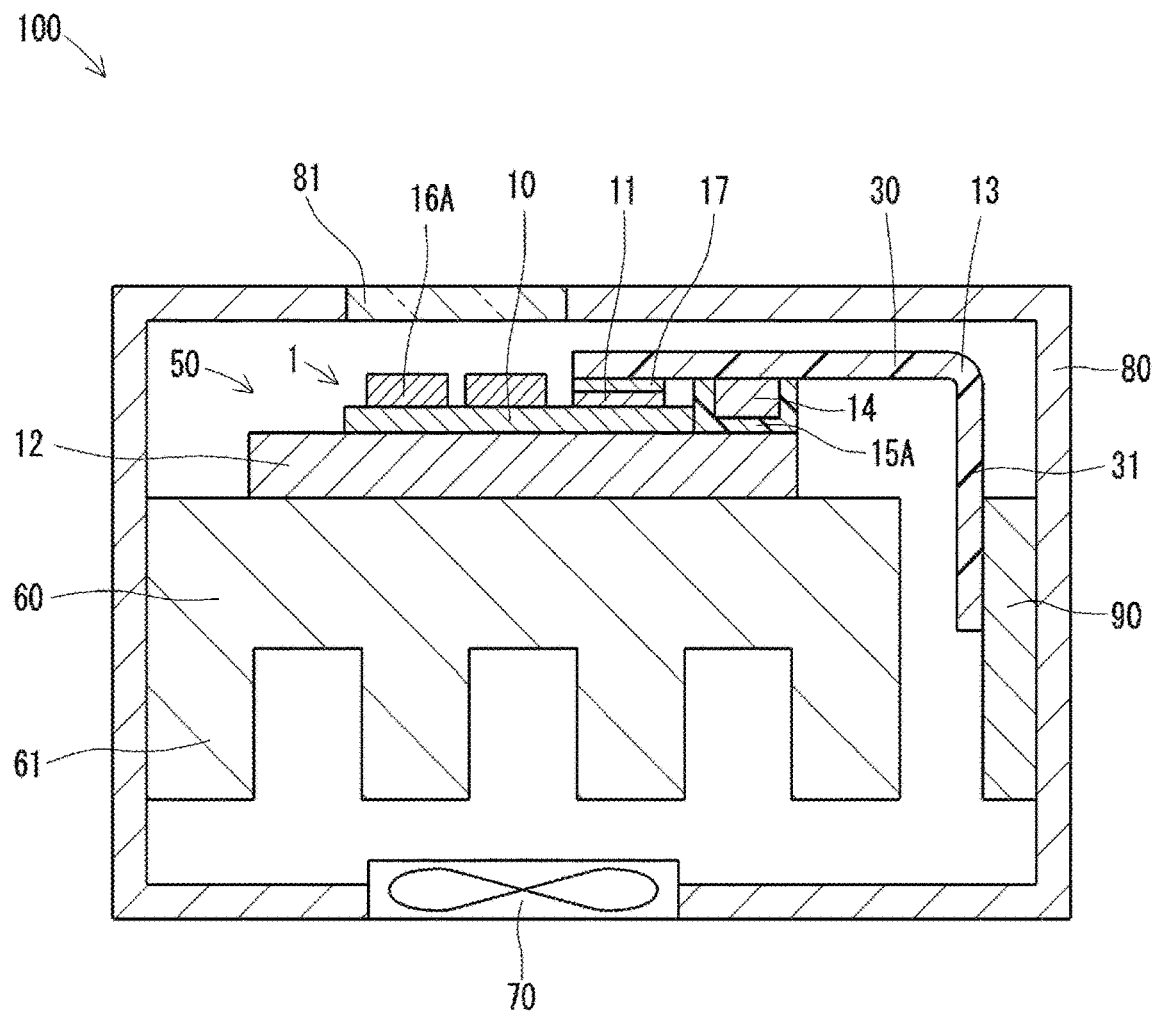
FIG. 4 is a schematic cross-sectional view of a light-emitting element module and a light-emitting device according to a third embodiment of the present disclosure.

FIG. 4 is a schematic cross-sectional view of a light-emitting element module and a light-emitting device according to a third embodiment of the present disclosure. A light-emitting device 100 includes a light-emitting element module 50, a heat sink 60 receiving the light-emitting element module 50, and a fan 70 for air-cooling the heat sink 60. The light-emitting device 100 further includes a housing 80 accommodating the light-emitting element module 50 and the heat sink 60, and a control board 90 electrically connected to the flexible substrate 13. In the present embodiment, elements mounted on the element substrate 1 are light-emitting elements. The light-emitting element module 50 includes the element substrate 1 and light-emitting elements 16A.

The heat sink 60 is formed from, for example, a metal material such as copper or aluminum. The heat sink 60 may be in any shape. The heat sink 60 may have multiple fins 61 to dissipate heat more efficiently. A portion of the heat sink 60 opposite to the fins 61 receives the light-emitting element module 50. The light-emitting element module 50 may be fixed to the heat sink 60 by, for example, screwing through a screw hole or a through-hole in the heat-dissipating member 12, or bonding the heat-dissipating member 12 to the heat sink 60 with a brazing material or other materials.

The fan 70 facing the fins 61 draws outside air, and generates air flow toward the fins 61 to air-cool the heat sink 60. The housing 80 has outlets (not shown) through which the air drawn by the fan 70 is discharged.

The control board 90 is electrically connected to the flexible substrate 13 to transmit light-emission control signals to the light-emitting element 16A with the signal wiring 13b on the flexible substrate 13. The control board 90 is also electrically connected to the temperature detecting element 14 to transmit the light-emission control signals to the light-emitting element 16A in accordance with a detected temperature. The control board 90 may also be electrically connected to the fan 70 to control the operation of the fan 70 in accordance with the detected temperature.

A portion of the housing 80 facing the light-emitting elements 16A includes a translucent window 81 through which light emitted from the light-emitting elements 16A travels outside.

In the light-emitting device 100 with this structure, the flexible substrate 13 may vibrate or be displaced under air flow drawn into the housing 80 by the fan 70 for air-cooling the heat sink 60. However, the adhesive layer 15 (15A) firmly bonds at least the first portion 30 in the flexible substrate 13 to the electrode wiring 11 and the heat-dissipating member 12, and is located between the temperature detecting element 14 and the heat-dissipating member 12. This structure reduces the likelihood of a short circuit that may be caused by the temperature detecting element 14 coming in contact with the heat-dissipating member 12.

Figure 5:
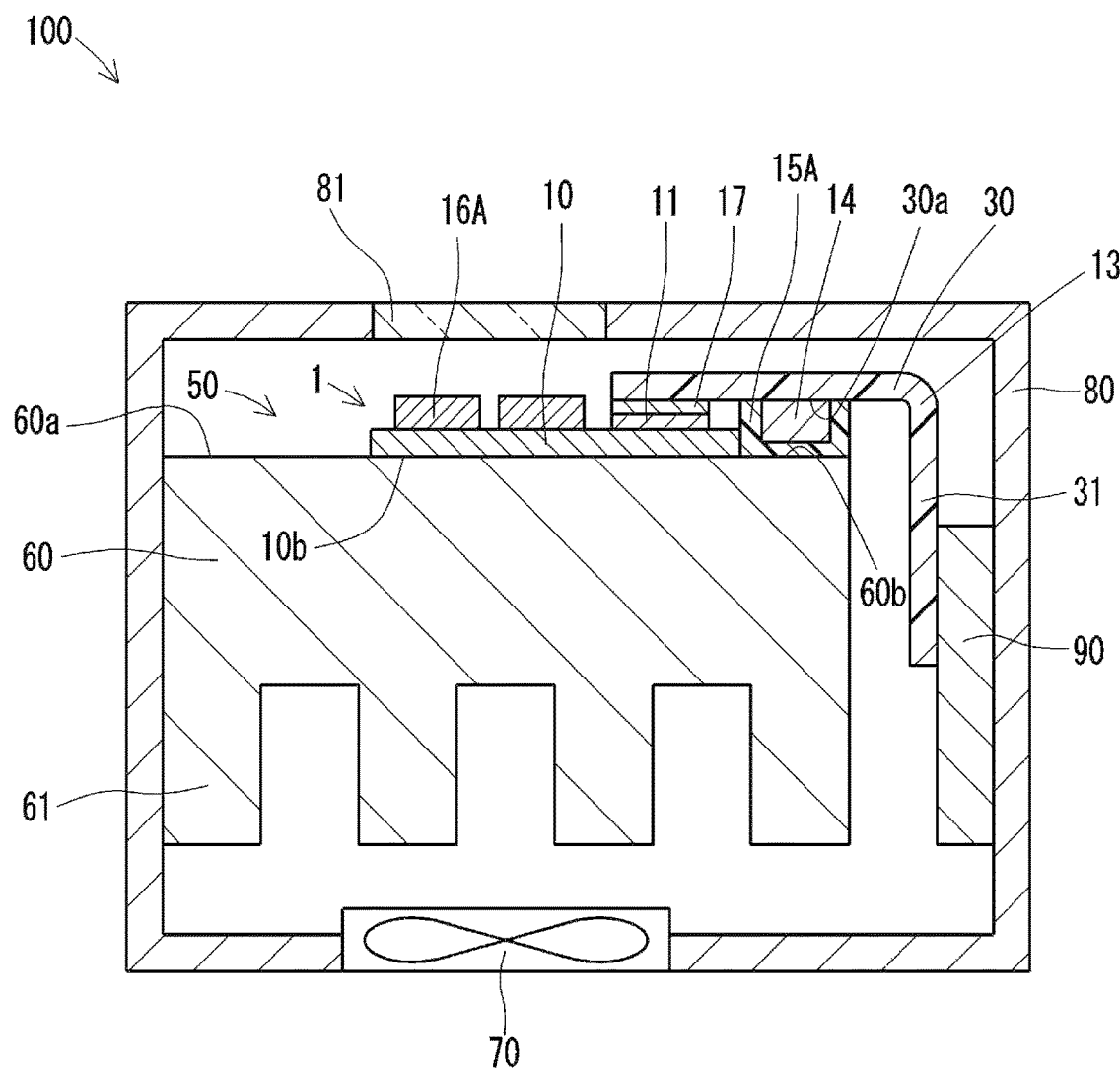
FIG. 5 is a schematic cross-sectional view of an element substrate, a light-emitting element module, and a light-emitting device according to a fourth embodiment of the present disclosure.

FIG. 5 is a schematic cross-sectional view of an element substrate, a light-emitting element module, and a light-emitting device according to a fourth embodiment of the present disclosure. In the present embodiment, the heat sink 60 also serves as the heat-dissipating member 12. In the embodiments described above, the heat-dissipating member 12 is a metal plate. In the present embodiment, the plate is replaced with the metal heat sink 60. The heat sink 60 in the third embodiment can serve as the heat sink 60 in the fourth embodiment.

As described above, the element substrate 1 according to the present embodiment has the same structure as in the second embodiment except that the element substrate 1 includes the heat sink 60 replaced with the plate serving as a heat-dissipating member and that the insulating substrate 10 has the second surface 10b directly in contact with the heat sink 60. In the light-emitting element module 50, the light-emitting elements 16A are mounted as elements on the element substrate 1 including the heat sink 60. The light-emitting device 100 according to the present embodiment is the same as the light-emitting device 100 according to the third embodiment except the light-emitting element module 50.

The insulating substrate 10 may be fixed to the heat sink 60 by, for example, screwing through a screw hole or a through-hole in the insulating substrate 10, or bonding the insulating substrate 10 to the heat sink 60 with a brazing material or other materials.

The heat sink 60 has a contact surface 60a in contact with the second surface 10b of the insulating substrate 10. The contact surface 60a has an extending area 60b extending from the insulating substrate 10 as viewed in plan. The extending area 60b is similar to the extending portion 20 of the heat-dissipating member 12 as the plate. The facing surface 30a of the first portion 30 in the flexible substrate 13 faces the extending area 60b.

In the present embodiment, the adhesive layer 15A is located between the temperature detecting element 14 and the extending area 60b in the heat sink 60, and between the facing surface 30a of the first portion 30 in the flexible substrate 13 and the extending area 60b in the heat sink 60. The bonding between the first portion 30 and the heat sink 60 with the adhesive layer 15A in addition to the bonding between the signal wiring 13b and the electrode wiring 11 with the bond 17 increases the bonding strength of the electrode wiring 11 and the heat sink 60 to the flexible substrate 13.

In the light-emitting device 100 with this structure, the flexible substrate 13 may vibrate or be displaced under air flow drawn into the housing 80 by the fan 70 for air-cooling the heat sink 60. However, the adhesive layer 15 (15A) firmly bonds at least the first portion 30 in the flexible substrate 13 to the electrode wiring 11 and the heat sink 60, and is located between the temperature detecting element 14 and the heat sink 60. This structure reduces the likelihood of a short circuit that may be caused by the temperature detecting element 14 coming in contact with the heat sink 60.

The present disclosure may be implemented in the following forms.

An element substrate according to an embodiment of the present disclosure includes an insulating substrate including ceramics, electrode wiring located on a first surface of the insulating substrate and electrically connectable to an element, a heat-dissipating member in contact with a second surface of the insulating substrate opposite to the first surface, a flexible substrate electrically connected to the electrode wiring, a temperature detecting element located on a facing surface of the flexible substrate facing the heat-dissipating member or facing the insulating substrate, and an adhesive layer located at least between the temperature detecting element and the heat-dissipating member or between the facing surface and the heat-dissipating member.

A light-emitting element module according to another embodiment of the present disclosure includes the element substrate described above, and a light-emitting element being the element electrically connected to the electrode wiring.

A light-emitting device according to another embodiment of the present disclosure includes the light-emitting element module described above, a heat sink receiving the light-emitting element module, and a fan that air-cools the heat sink.

The element substrate, the light-emitting element module, and the light-emitting device according to one or more embodiments of the present disclosure allow accurate temperature detection of the elements using the temperature detecting element, reduce the likelihood of a short circuit in the temperature detecting element mounted on the flexible substrate, and increase the bonding strength between the flexible substrate and the electrode wiring.

Although the present disclosure has been described in detail, the present disclosure is not limited to the embodiments described above, and may be changed or modified variously without departing from the spirit and scope of the present disclosure. For example, the embodiments may be combined one another. The embodiments described above are thus merely illustrative in all respects. The scope of the present disclosure is defined not by the description given above but by the claims. Any modifications and alterations contained in the claims fall within the scope of the present disclosure.

REFERENCE SIGNS LIST 1 element substrate
10 insulating substrate
10a first surface
10b second surface
11 electrode wiring
12 heat-dissipating member
13 flexible substrate
13a resin film
13b signal wiring
13b1, 13b2 wire
14 temperature detecting element
15, 15A adhesive layer
16 element
16 Alight-emitting element
17 bond
20 extending portion
30 first portion
30a facing surface
31 second portion
50 light-emitting element module
60 heat sink
60a contact surface
60b extending area
61 fin
70 fan
80 housing
81 window
90 control board
100 light-emitting device

The invention claimed is:

1. An element substrate, comprising:
an insulating substrate comprising ceramics, the insulating substrate including a first surface and a second surface opposite to the first surface;
electrode wiring located on the first surface and electrically connectable to an element mounted on the first surface;
a heat-dissipating member in contact with the second surface, the heat-dissipating member including an extending portion extending from the insulating substrate;
a flexible substrate electrically connected to the electrode wiring, and having a facing surface facing the extending portion of the heat-dissipating member and facing the first surface of the insulating substrate, wherein the flexible substrate has a resin film and signal wiring is located on a surface of the resin film;
a temperature detecting element located on the facing surface; and
an adhesive layer located at least between the temperature detecting element and the heat-dissipating member or between the facing surface and the heat-dissipating member,
wherein
the resin film is strip-shaped,
the signal wiring includes a pair of wires extending in a longitudinal direction of the resin film, and
the temperature detecting element is located between the pair of wires in a width direction of the resin film.

2. The element substrate according to claim 1, wherein the temperature detecting element is surrounded by the adhesive layer.

3. The element substrate according to claim 1, wherein the heat-dissipating member includes a plate comprising metal.

4. The element substrate according to claim 1, wherein the heat-dissipating member includes a heat sink comprising metal.

5. The element substrate according to claim 1, wherein the adhesive layer is located at least partially between the temperature detecting element and the heat-dissipating member.

6. The element substrate according to claim 1, wherein the adhesive layer is located at least partially between the facing surface and the heat-dissipating member.

7. A light-emitting element module, comprising:
the element substrate according to claim 1; and
a light-emitting element being the element electrically connected to the electrode wiring.

8. The light-emitting element module according to claim 7, wherein the heat-dissipating member includes a heat sink comprising metal.

9. A light-emitting device, comprising:
the light-emitting element module according to claim 7;
a heat sink receiving the light-emitting element module; and
a fan configured to air-cool the heat sink.

10. The light-emitting device according to claim 9, wherein the heat-dissipating member includes a heat sink comprising metal.

11. An element substrate, comprising:
an insulating substrate comprising ceramics, the insulating substrate including a first surface and a second surface opposite to the first surface;
electrode wiring located on the first surface and electrically connectable to an element;

a heat-dissipating member in contact with the second surface;

a flexible substrate electrically connected to the electrode wiring, and having a facing surface facing the heat-dissipating member or facing the insulating substrate;

a temperature detecting element located on the facing surface; and an adhesive layer located at least between the temperature detecting element and the heat-dissipating member or between the facing surface and the heat-dissipating member, wherein the flexible substrate includes a resin film that is strip-shaped and signal wiring located on a surface of the resin film, the signal wiring includes a pair of wires extending in a longitudinal direction of the resin film, and the temperature detecting element is located between the pair of wires in a width direction of the resin film.

* * * * *